United States Patent
Ko et al.

(10) Patent No.: US 8,902,671 B2
(45) Date of Patent: Dec. 2, 2014

(54) MEMORY STORAGE DEVICE, MEMORY CONTROLLER THEREOF, AND METHOD FOR PROGRAMMING DATA THEREOF

(71) Applicant: Phison Electronics Corp., Miaoli (TW)

(72) Inventors: Hong-Lipp Ko, Miaoli County (TW); Kuo-Lung Lee, Taipei (TW); Teng-Chun Hsu, Pingtung County (TW)

(73) Assignee: Phison Electronics Corp., Miaoli (TW)

( * ) Notice: Subject to any disclaimer, the term of this patent is extended or adjusted under 35 U.S.C. 154(b) by 133 days.

(21) Appl. No.: 13/786,473

(22) Filed: Mar. 6, 2013

(65) Prior Publication Data

US 2014/0140142 A1 May 22, 2014

(30) Foreign Application Priority Data

Nov. 20, 2012 (TW) .............................. 101143308 A

(51) Int. Cl.
| | | |
|---|---|---|
| *G11C 7/00* | (2006.01) | |
| *G11C 7/10* | (2006.01) | |
| *G11C 16/16* | (2006.01) | |
| *G11C 16/34* | (2006.01) | |
| *G06F 12/02* | (2006.01) | |
| *G06F 13/38* | (2006.01) | |
| *G06F 12/00* | (2006.01) | |
| *G11C 16/10* | (2006.01) | |
| *G06F 3/06* | (2006.01) | |
| *G06F 12/08* | (2006.01) | |
| *G06F 13/16* | (2006.01) | |

(52) U.S. Cl.
CPC ............... *G11C 16/10* (2013.01); *G06F 3/064* (2013.01); *G06F 12/0246* (2013.01); *G06F 2212/2022* (2013.01); *G11C 7/1006* (2013.01); *G11C 7/1084* (2013.01); *G06F 12/02* (2013.01); *G06F 12/0868* (2013.01); *G06F 12/00* (2013.01); *G06F 13/1694* (2013.01); *G11C 7/10* (2013.01)
USPC ............ 365/185.33; 365/185.29; 365/189.16; 365/189.17; 365/189.05

(58) Field of Classification Search
CPC ................ G06F 12/0246; G06F 3/064; G06F 2212/2022; G06F 12/0868; G06F 13/1694; G06F 12/00; G06F 12/02; G11C 7/10; G11C 7/1006; G11C 7/1084
USPC ............. 365/185.29, 185.33, 189.16, 189.17; 711/103; 714/763
See application file for complete search history.

(56) References Cited

U.S. PATENT DOCUMENTS

| | | | |
|---|---|---|---|
| 2005/0144365 A1* | 6/2005 | Gorobets et al. ............... 711/103 |
| 2006/0039196 A1* | 2/2006 | Gorobets et al. .......... 365/185.01 |
| 2007/0033328 A1* | 2/2007 | Sinclair et al. ................ 711/103 |
| 2008/0307158 A1* | 12/2008 | Sinclair .......................... 711/103 |

\* cited by examiner

*Primary Examiner* — Ly D Pham
(74) *Attorney, Agent, or Firm* — Jianq Chyun IP Office

(57) ABSTRACT

A method for programming data is provided for a memory storage device having a rewritable non-volatile memory module and a buffer memory. The method includes receiving a plurality of data including a first-type data and at least one second-type data, and a size of the first-type data is smaller than a data size threshold. The method includes temporarily storing the plurality of data into the buffer memory, and programming the first-type data and at least one part of the at least one second-type data stored in the buffer memory into a physical program unit set if it is determined that the plurality of data are complied with a predetermined condition. The method includes obtaining writing statuses of the first-type data and the at least one part of the at least one second-type data at the same time.

18 Claims, 8 Drawing Sheets

MEMORY STORAGE DEVICE, MEMORY CONTROLLER THEREOF, AND METHOD FOR PROGRAMMING DATA THEREOF

CROSS-REFERENCE TO RELATED APPLICATION

This application claims the priority benefit of Taiwan application serial no. 101143308, filed on Nov. 20, 2012. The entirety of the above-mentioned patent application is hereby incorporated by reference herein and made a part of this specification.

BACKGROUND

1. Field of the Invention

The invention relates to a method for programming data, and more particularly, to a method for programming data in a rewritable non-volatile memory module, and a memory controller and a memory storage device using the same.

2. Description of Related Art

Rewritable non-volatile memory is one of the most adaptable memories for portable electronic products such as digital camera, cell phone and MP3 player due to its data nonvolatility, low power consumption, small volume and non-mechanical structure. A solid state drive is a storage device adopting flash memory as storage medium.

Generally, a flash memory module of a flash memory storage device is divided into a plurality of physical blocks, in which the physical blocks are further divided into a plurality of physical pages. In the flash memory, the physical block is an erase unit and the physical page is a writing unit. Since only unidirectional programming (i.e., by programming the value of the memory cell from 1 to 0) may be performed to programming memory cells of the flash memory, a direct writing to a programmed physical page (i.e., page that is stored with old data) may not be performed before such physical page has been erased for re-programming. In particular, since the physical block is used as a unit for erasing the flash memory, if an erasing operation is performed to the physical page stored with old data, the physical block that contains the physical page is erased entirely. Therefore, the physical blocks of the flash memory module are divided into a data area and a spare area, in which the physical blocks in the data area are physical blocks already stored with data and the physical blocks in the spare area are physical block not being used. In which, if the host system intends to write data into the flash memory storage device, the physical block in the spare area may be accessed by the control circuit of the flash memory storage device for writing data, and the physical blocks being accessed are related to the data area. In addition, after an erasing operation to the physical blocks of the data area is performed, the physical blocks being erased are related to the spare area.

Based on above architecture in regard to the applications of using flash memory as storage device to ensure a secure data-writing, in order to align the data with the physical pages, each time a write command from the host system is processed, it is necessary to have old valid data read from the flash memory, so as to fill the data bring written. Once the data is programmed into the flash memory, a message indicating whether the writing operation is completed is sent back to the host system. That is to say, in order to ensure a secure data-writing operation, a programming result needs to be reply to the host system so as to control writing statuses of the data. Obviously, in the case if the host system intends to establish a plurality of write commands sequentially, it is necessary to have above-said processes performed for each of the writing commands. Since each of the writing commands a specific amount of program time, it is quite difficult to increase writing speed if under using of the secure data writing.

SUMMARY

Accordingly, the invention is directed to a method for programming data, a memory controller and a memory storage device using the same, which may be used to ensure a secure data-writing for the memory storage device while increasing overall writing speed.

The invention provides a method for programming data adapted for a memory storage device, the memory storage device includes a buffer memory and a rewritable non-volatile memory module, the rewritable non-volatile memory module has a plurality of physical erase units, and each of the physical erase units has a plurality of physical program units. The method includes receiving a plurality of data including a first-type data and at least one second-type data, and a size of the first-type data is smaller than a data size threshold. The method includes temporarily storing the plurality of data into the buffer memory, and programming the first-type data and at least one part of the at least one second-type data stored in the buffer memory into a physical program unit set if it is determined that the plurality of data are complied with a predetermined condition, the physical program unit set includes n physical program units and n is a positive integer. The method includes obtaining writing statuses of the first-type data and the at least one part of the at least one second-type data at the same time.

From another perspective, the invention provides a memory controller, adapted for managing a rewritable non-volatile memory module, the memory controller includes a host system interface, a memory interface, a buffer memory and a memory management circuit. In which, the host system interface is configured to electrically connect a host system. The memory interface is configured to electrically connect the rewritable non-volatile memory module, in which the rewritable non-volatile memory module has multiple physical erase units, and each physical erase unit has multiple physical program units. The memory management circuit is electrically connected to the host system interface, the memory interface and the buffer memory. In which the memory management circuit receives a plurality of data, the plurality of data include a first-type data and at least one second-type data, in which a size of the first-type data is smaller than a data size threshold. The memory management circuit temporarily stores the plurality of data into the buffer memory, and programs the first-type data and at least one part of the at least one second-type data temporarily stored in the buffer memory into a physical program unit set after the plurality of data are determined to be complied with a predetermined condition, the physical program unit set has n physical program units and n is a positive integer. The memory management circuit obtains writing statuses of the first-type data and the at least one part of the at least one second-type data at the same time.

From another aspect, the invention provides a memory storage device, which includes a rewritable non-volatile memory module, a connector and a memory controller. In which a rewritable non-volatile memory module includes a plurality of physical erase units, and each of the plurality of the physical erase units has a plurality of physical program units. The connector is configured to electrically connect a host system. The memory controller is electrically connected to the rewritable non-volatile memory and the connector, the memory controller includes a buffer memory. The memory controller receives a plurality of data, the plurality of data include a first-type data and at least one second-type data, in which a size of the first-type data is smaller than a data size threshold. The memory controller temporarily stores the plurality of data into the buffer memory, and programs the first-type data and at least one part of the at least one second-type data temporarily stored in the buffer memory into a physical program unit set after the plurality of data are determined to be complied with a predetermined condition, the physical program unit set has n physical program units and n is a positive integer. The memory controller obtains writing statuses of the first-type data and the at least one part of the at least one second-type data at the same time.

In view of above, the invention provides a method which first accumulate a plurality of small data from host system, after said data are successfully programmed into the rewritable non-volatile memory module together, a plurality of writing-completed messages are replied together to the host system in respond to a plurality of write command corresponding to the said data. As a result, the data may be written into the memory storage device quickly and securely.

To make the above features and advantages of the invention more comprehensible, several embodiments accompanied with drawings are described in detail as follows.

DESCRIPTION OF THE EMBODIMENTS

Generally, a memory storage apparatus (also known as a memory storage system) includes a rewritable non-volatile memory module and a controller (also known as a control circuit). The memory storage apparatus is usually configured together with a host system so that the host system may write data into or read data from the memory storage device.

Figure 1A:
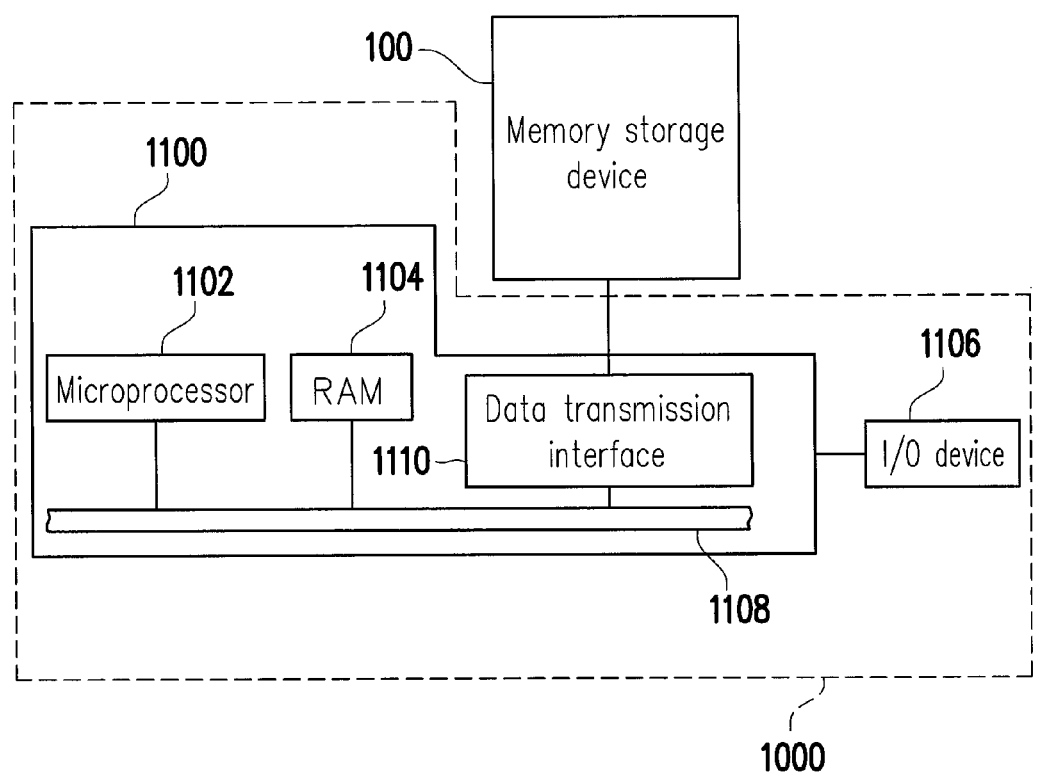
FIG. 1A is a schematic diagram of a host system using a memory storage device according to an exemplary embodiment of the invention.

FIG. 1A is a schematic diagram of a host system using a memory storage device according to an exemplary embodiment of the invention.

Figure 1B:
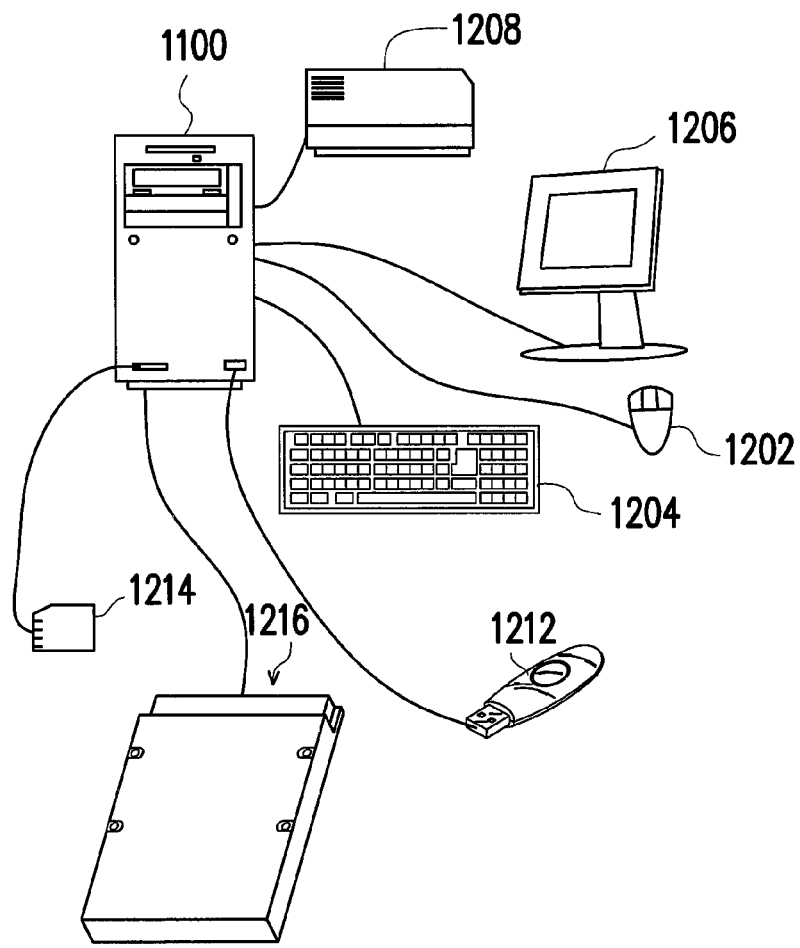
FIG. 1B is a schematic diagram of a computer, an input/output device, and a memory storage device according to an exemplary embodiment of the invention.

The host system 1000 includes a computer 1100 and an input/output (I/O) device 1106. The computer 1100 includes a microprocessor unit 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the exemplary embodiment of the invention, the memory storage device 100 is electrically connected to other devices of the host system 1000 through the data transmission interface 1110. By using the microprocessor 1102, the RAM 1104 and the Input/Output device 1106, the host system 1000 may write data into or read from the memory storage device 100. For example, the memory storage device 100 may be a memory card 1214, a flash drive 1212, or a solid state drive (SSD) 1216 as shown in FIG. 1B.

Figure 1C:
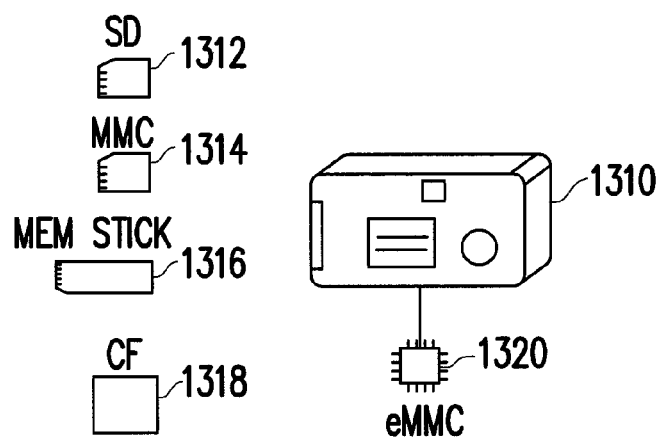
FIG. 1C is a schematic diagram of a host system and a memory storage device according to another exemplary embodiment of the invention.

Generally, the host system 1000 may be any system capable of storing data. Although the present exemplary embodiment is described using a computer system as the host system 1000, in another exemplary embodiment of the invention, the host system 1000 may also be a cell phone, a digital camera, a video camera, a telecommunication device, an audio player or a video player. For example, if the host system is a digital camera 1310, the memory storage device being used may be a SD (Secure Digital) card 1312, a MMC (Multimedia Card) card 1314, a memory stick 1316, a CF (Compact Flash) card 1318 or an embedded storage device 1320 (as shown in FIG. 1C). The embedded storage device 1320 includes an embedded MMC (eMMC). It should be mentioned that the eMMC is electrically connected to a substrate of the host system, directly.

Figure 2:
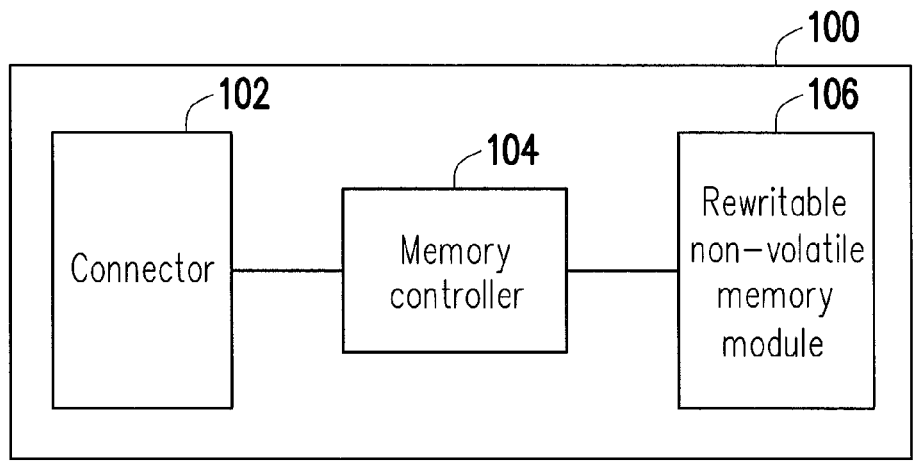
FIG. 2 is a schematic block diagram of the memory storage device in FIG. 1A.

FIG. 2 is a block diagram of the memory storage device 100 in FIG. 1A. Referring to FIG. 2, the memory storage device 100 includes a connector 102, a memory controller 104 and a rewritable non-volatile memory storage module 106.

The connector 102 is electrically connected to the memory controller 104 and configured to electrically connect the host system 1000. In the present exemplary embodiment, the type of data transmission interface supported by the connector 102 is Universal Serial Bus (USB) interface. However, in other exemplary embodiments, the connector 102 may also be a serial advanced technology attachment (SATA) interface, an embedded MMC (eMMC) interface, a Parallel Advanced Technology Attachment (PATA) interface, an Institute of Electrical and Electronic Engineers (IEEE) 1394 interface, a peripheral component interconnect (PCI) Express interface, a secure digital (SD) interface, a memory stick (MS) interface, a compact flash (CF) interface, an integrated device electronics (IDE) interface or other suitable interfaces, the invention is not limited thereto.

The memory controller 104 executes a plurality of logic gates or control commands which are implemented in a hardware form or in a firmware form, so as to perform operations of writing, reading or erasing data in the rewritable non-volatile memory module 106 according to the commands of the host 1000. In which, the memory controller 104 processes data that the host system 1000 intended to the rewritable non-volatile memory module 106 based on the method for programming data according to the present exemplary embodiment. The method for programming data of the present exemplary embodiment is described below with reference of accompanying drawings.

The rewritable non-volatile memory module 106 is electrically connected to the memory controller 104. The rewritable non-volatile memory module 106 is a Multi Level Cell (MLC) NAND flash memory module, but the invention is not limited thereto. The rewritable non-volatile memory module 106 may also be a Single Level Cell (SLC) NAND flash memory module, other flash memory modules or any memory module having the same features. Furthermore, the rewritable non-volatile memory module 106 includes a plurality of physical erase units, in which each of the physical erase units has a plurality of physical program units. The physical program units belonged to the same physical erase unit may be written into separately and erased simultaneously. That is, the physical erase unit is the minimum unit for erasing. Namely, each physical erase unit contains the least number of memory cells to be erased together. The physical program unit is the minimum unit for programming. That is, the program unit is the minimum unit for writing data. According to the present exemplary embodiment, the physical erase unit is a physical block, and the physical program unit is a physical page, but the invention is not limited thereto.

Figure 3:
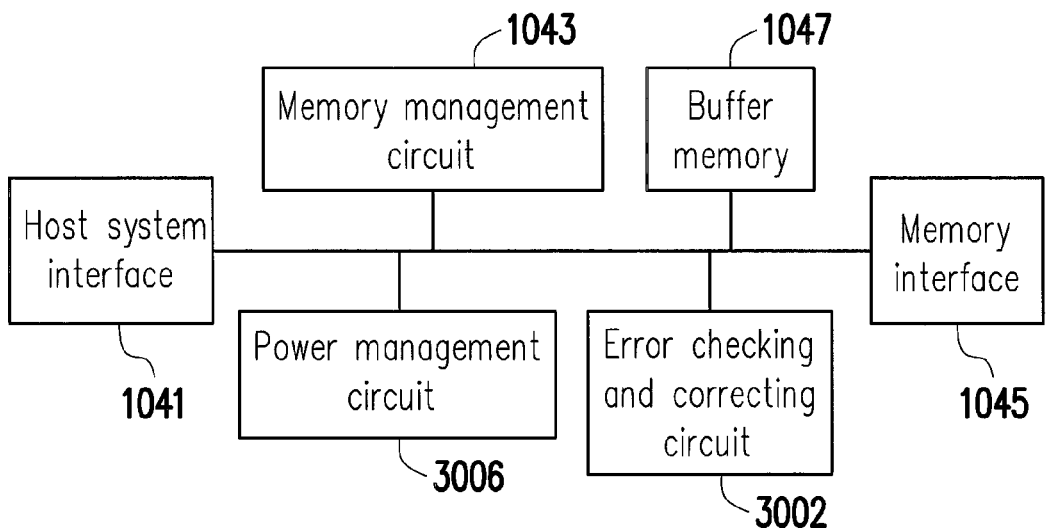
FIG. 3 is a schematic block diagram of a memory controller according to an exemplary embodiment of the invention.

FIG. 3 is a schematic block diagram of a memory controller according to an exemplary embodiment of the invention. Referring to FIG. 3, the memory controller 104 includes a host system interface 1041, a memory management circuit 1043, a memory interface 1045 and a buffer memory 1047.

The host system interface 1041 is electrically connected to the memory management circuit 1043, and configured to electrically connect the host system 1000 through the connector 102. The host system interface 1041 is configured to receive and identify commands and data transmitted from the host system 1000. Further, the commands and data transmitted from the host system 1000 are transmitted to the memory management circuit 1043 through the host system interface 1041. In the present exemplary embodiment, the host system interface 1041 is a USB interface which is corresponding to the connector 102. In other exemplary embodiments, the host system interface 1041 may also be a SATA interface, an MMC interface, a PATA interface, an IEEE 1394 interface, a PCI Express interface, a SD interface, an MS interface, a CF interface, an IDE interface, or other suitable interfaces.

The memory management circuit 1043 is configured to control overall operations of the memory controller 104. More specifically, the memory management circuit 1043 has a plurality of control commands, the control commands are executed to implement the method for programming data of the present exemplary embodiment if the memory storage device 100 is powered on.

In an exemplary embodiment, the control commands of the memory management circuit 1043 are implemented in a form of firmware. For example, the memory management circuit 1043 has a microprocessor unit (not illustrated) and a ROM (not illustrated), and the control commands are burned into the ROM. During the operation of the memory storage device 100, the control commands are executed by the microprocessor unit to implement the method for programming data of the present exemplary embodiment.

In another exemplary embodiment of the invention, the control commands of the memory management circuit 1043 may also be stored as program codes (i.e., firmware codes) in a specific area (for example, the system area in the rewritable non-volatile memory module 106 exclusively dedicated for storing system data) of the rewritable non-volatile memory module 106. In addition, the memory management circuit 1043 has a microprocessor unit (not illustrated), a ROM (not illustrated) and a RAM (not illustrated). In which, the ROM has an activate code segment, which is executed by the microprocessor unit to load the control commands stored in the rewritable non-volatile memory module 106 to the RAM of the memory management circuit 1043 if the memory controller 104 is enabled. Next, the control commands are executed by the microprocessor unit to implement the method for programming data of the present exemplary embodiment.

Further, in another exemplary embodiment of the invention, the control commands of the memory management circuit 1043 may also be implemented in a form of hardware. For example, the memory management circuit 1043 includes a microprocessor, a memory management unit, a memory writing unit, a memory reading unit, a memory erase unit and a data processing unit. The memory management unit, the memory writing unit, the memory reading unit, the memory erase unit and the data processing unit are electrically connected to the microprocessor. In which, the memory management unit is configured to manage the physical erase unit in the rewritable non-volatile memory module 106. The memory writing unit is configured to provide a writing command to the rewritable non-volatile memory module 106, thereby writing data into the rewritable non-volatile memory module 106. The memory reading unit is configured to provide a reading command to the rewritable non-volatile memory module 106, thereby reading data from the rewritable non-volatile memory module 106. The memory erase unit is configured to provide an erasing command to the rewritable non-volatile memory module 106, thereby erasing data from the rewritable non-volatile memory module 106. The memory processing unit is configured to process data to be written into the rewritable non-volatile memory module 106 and data read from the rewritable non-volatile memory module 106.

The memory interface 1045 is electrically connected to the memory management circuit 1043 and configured to electrically connect the memory controller 104 and the rewritable non-volatile memory module 106. In this case, the memory controller 104 may perform related operations to the rewritable non-volatile memory module 106. That is, a write data the rewritable non-volatile memory module 106 is converted to a format acceptable to the rewritable non-volatile memory module 106 through the memory interface 1045.

The buffer memory 1047 may be a static random access memory (SRAM) or a dynamic random access memory (DRAM), the invention is not limited thereto. The buffer memory 1047 is electrically connected to the memory management circuit 1043 and configured to temporarily store commands and data from the host system 1000 or data from the rewritable non-volatile memory module 106.

In another exemplary embodiment of the invention, the memory controller 104 further includes an error checking and correcting unit 3002. The error checking and correcting circuit 3002 is electrically connected to the memory management circuit 1043 and configured to perform an error checking and correcting process to ensure the correctness of data. Specifically, if a writing command from the host system 1000 is received by the memory management circuit 1043, the error checking and correcting circuit 3002 generates an error checking and correcting code (ECC code) for data corresponding to the writing command, and the memory management circuit 1043 writes data and the ECC code corresponding to the writing command into the rewritable non-volatile memory module 106. Next, if reading data from the rewritable non-volatile memory module 106, the memory management circuit 1043 also reads the ECC Code corresponding to such data, and the error checking and correcting circuit 3002 performs an error checking and correcting process to the read data based on the read ECC code, so as to identify whether data has error bits.

In yet another exemplary embodiment of the invention, the memory controller 104 further includes a power management circuit 3006. The power management unit 3006 is electrically connected to the memory management circuit 1043 and configured to control the power of the memory storage device 100.

Figure 4:
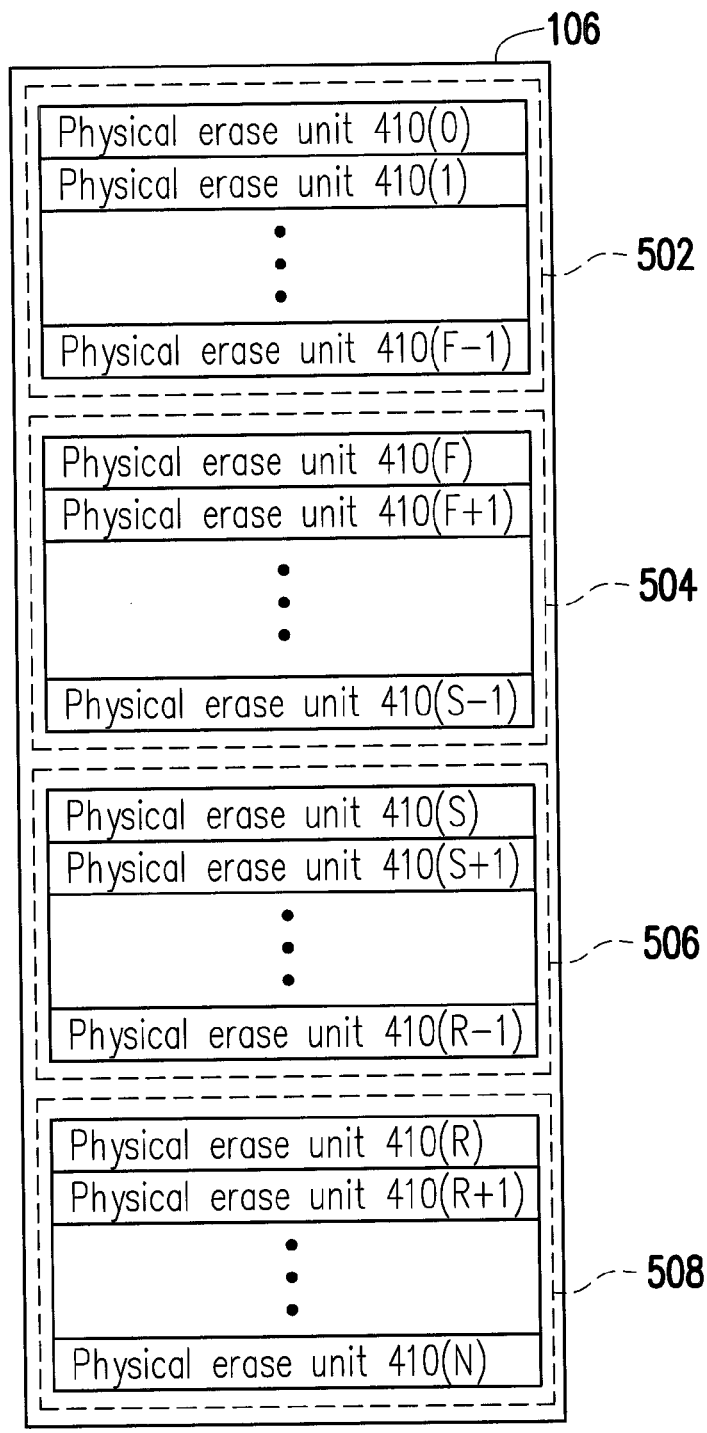
FIGS. 4 and 5 are schematic diagrams illustrating management of a rewritable non-volatile memory module according to an exemplary embodiment of the invention.
Figure 5:
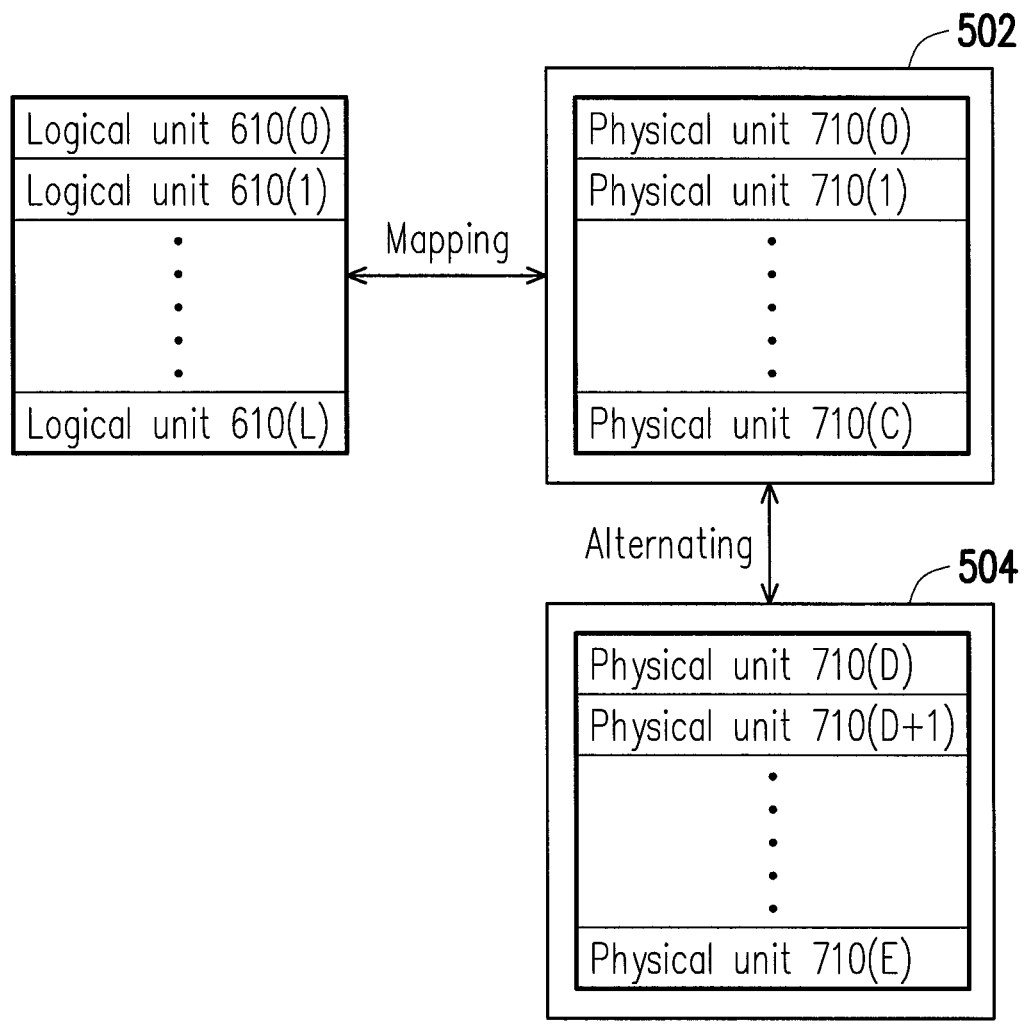

FIGS. 4 and 5 are schematic diagrams illustrating management of a rewritable non-volatile memory module according to an exemplary embodiment of the invention.

The terms, such as "retrieve", "exchange", "group", "alternate" and so forth, are logical concepts which describe operations in the physical erase units of the rewritable non-volatile memory module 106. That is, the physical erase units of the rewritable non-volatile memory module 106 are logically operated, but actual positions of the physical units of the rewritable non-volatile memory module 106 are not changed.

Referring to FIG. 4, the rewritable non-volatile memory module 106 includes physical erase units 410(0) to 410(N). The memory management circuit 1043 in the memory controller 104 logically groups the physical erase units 410(0) to 410(N) into a data area 502, a spare area 504, a system area 506 and a replacement area 508. In which, marks F, S, R and N as illustrated in FIG. 4 are positive integers representing a number of the physical erase units configured in each area, and may be varied based on a size of the rewritable non-volatile memory module 106 used by the manufacturer of the memory storage system 100.

Logically, the physical erase units belonged to the data area 502 and the spare area 504 are configured to store data from the host system 1000. For example, the physical erase units of the spare area 502 is regarded as the physical erase units that have been stored with data, whereas the physical erase units of the spare area 504 are physical erase units configured to write new data. In other words, the physical erase units of the spare area 504 are either blank or available physical erase units (i.e., no data recorded or data marked as invalid). If receiving a writing command and data from the host system 1000, the memory management unit 1043 retrieves a physical erase unit from the spare area 504 and writes data into the retrieved physical erase unit, so as to replace the physical erase unit in the data area 502. Alternatively, if a required data merging operation to a logical erase unit is performed, the memory management circuit 1043 retrieves a physical erase unit from the spare area 504 and writes data therein, so as to replace to the physical erase unit previously mapped with said logical erase unit.

The physical erase units logically belonged to the system area 506 is configured to record system data. For example, system data includes information related to manufacturer and model of the rewritable non-volatile memory module 106, a number of physical erase units in the rewritable non-volatile memory module 106, a number of the physical program unit in each physical erase unit, and so forth.

If a physical erase unit in the data area 502, the spare area 504 or the system area 506 is damaged, the physical erase unit logically belonged to the replacement area 508 is a replacement to such damaged physical erase unit. More specifically, during the operation of the memory storage device 100, if there are still available physical erase units in the replacement area 508 if the physical erase unit in the data area 502 is damaged, the memory management circuit 1043 retrieves an available physical erase unit from the replacement area 508 for replacing the damaged physical erase unit in the data area 502. If there is no available physical erase units in the replacement area 508 if a physical erase unit is damaged, the memory storage device 100 is announced by the memory management circuit 1043 as being in a write-protect status, and data cannot be written therein.

Therefore, during the operation of the memory storage device 100, the physical erase units of the data area 502, the spare area 504, the system area 506 and the replacement area 508 may be dynamically changed. For example, the physical erase units used for alternately storing data may be belonged to the data area 502 or the spare area 504, dynamically.

Referring to FIG. 5, in the memory management circuit 1043, physical blocks (including the physical erase units 410(0) to 410(F−1)) of the data area 502 and physical blocks (including the physical erase units 410(F) to 410(S−1)) of the spare area 504 are respectively grouped into a plurality of physical units 710(0) to 710(C) and 710(D) to 710(E), and the rewritable non-volatile memory module 106 is managed in physical units, in which each of the physical units includes n physical erase unit and n is a positive integer. C, D and E are also positive integers having values related to the values of n, F and S. According to an exemplary embodiment, each physical unit has two physical erase units, or in another exemplary embodiment, each physical unit is composed of two physical erase units. In the case if the rewritable non-volatile memory module 106 includes two or more memory dies, the two physical erase units may respectively belonging to different dies. Nevertheless, it should be understood that the invention is not limited thereto. In another exemplary embodiment, each physical unit may have one physical erase unit or may be composed of one physical erase unit. Alternatively, in yet another exemplary embodiment, each physical unit may have at least one physical erase unit in the same memory die or different dies, or may be composed of at least one physical erase unit in the same memory die or different dies.

In order to allow the host system 1000 to access the rewritable non-volatile memory module 106, the memory management circuit 1043 may arrange a plurality of logical units 610(0) to 610(L) for mapping to the physical units 710(0) to 710(C) in the data area 502. In which, each logical unit has n logical erase units, and each logical erase unit includes a plurality of logical program units. Furthermore, the physical program units in the logical units 610(0) to 610(L) are sequentially mapped to the physical program units in the physical units 710(0) to 710(C).

The memory management circuit 1403 provides the logical erase units 610(0) to 610(L) to the host system 1000, and maintains a logical address-physical address mapping table to record mapping relations of the logical units 610(0) to 610(L) and the physical units 710(0) to 710(C). Once the host system 1000 intends to access a logical access address, the memory management circuit 1043 confirms the logical erase units and the logical program units that are corresponding to the logical access address, and searches a physical program units mapped thereto through the logical address-physical address mapping table for accessing.

According to the exemplary embodiment, if a plurality of write commands are continuously or non-continuously established by the host system 1000 to write a plurality of data into the memory storage device 100, the memory management circuit 1043 may receive the plurality of data corresponding to the plurality of write commands and temporarily store the plurality of data in the buffer memory 1047. In which, the plurality of data include one first-type data and at least one second-type data, a size of the first-type data need to be smaller than a data size threshold (e.g., 16 KB, but the invention is not limited thereto), and whether a size of the second-type data exceeds the data size threshold is not particularly limited. Once it is determined that the plurality of data are complied with a predetermined condition, the memory management circuit 1043 may program the first-type data and at least one part of the at least one second-type data temporarily stored in the buffer memory 1047 into a physical program unit set in the rewritable non-volatile memory module 106 at the same time. The physical program unit set has n physical program units and n is a positive integer. That is, the physical program unit set may include one physical program unit or a plurality of physical program units. Meanwhile, the memory management circuit 1043 may obtain writing statuses of the first-type data and the at least one part of the at least one second-type data being programmed into the rewritable non-volatile memory module 106.

For instance, it is assumed that each physical unit has 4 physical erase units, and the size of one physical program unit is 4 KB. In this case, one physical program unit set includes 4 physical program units (i.e., n is equal to 4), and the size of one physical program unit set is 16 KB. In addition, according to the present exemplary embodiment, it is assumed that the memory management circuit 1043 determines that the plurality of data are complied with the predetermined condition if a size of the plurality of data temporarily stored in the buffer memory 1047 reaches a size of the physical program unit set (i.e., the 4 physical program units).

In the case if the host system 1000 intends to write three data, in which a size of a first data is 9 KB, a size of a second data is 20 KB and a size of a third data is 11 KB. Once the host system 1000 intends to establish a first write command to write the first data, in the case if the buffer memory 1047 is not stored with any data, the memory management circuit 1043 may temporarily store the data into the buffer memory 1047 instead of have the first data programmed into the rewritable non-volatile memory module 106. Moreover, the memory management circuit 1043 may also record a logical access address and a number of sectors corresponding to the first data into the buffer memory 1047.

Later, two write commands that are respectively corresponding to the second data and the third data may then be established and sent by the host system 1000. Once said two write commands are received, the memory management circuit 1043 may temporarily store the second data and the third data into the buffer memory 1047 accordingly, and the memory management circuit 1043 may record the logical access addresses and numbers of the sectors that are respectively corresponding to the second data and the third data into the buffer memory 1047. Since the size of the plurality of data temporarily stored in the buffer memory 1047 reaches the size of the physical program unit set, the memory management circuit 1043 determines that the plurality of data are complied with the predetermined condition and start to practically programming the data into the physical program unit set.

Figure 6:
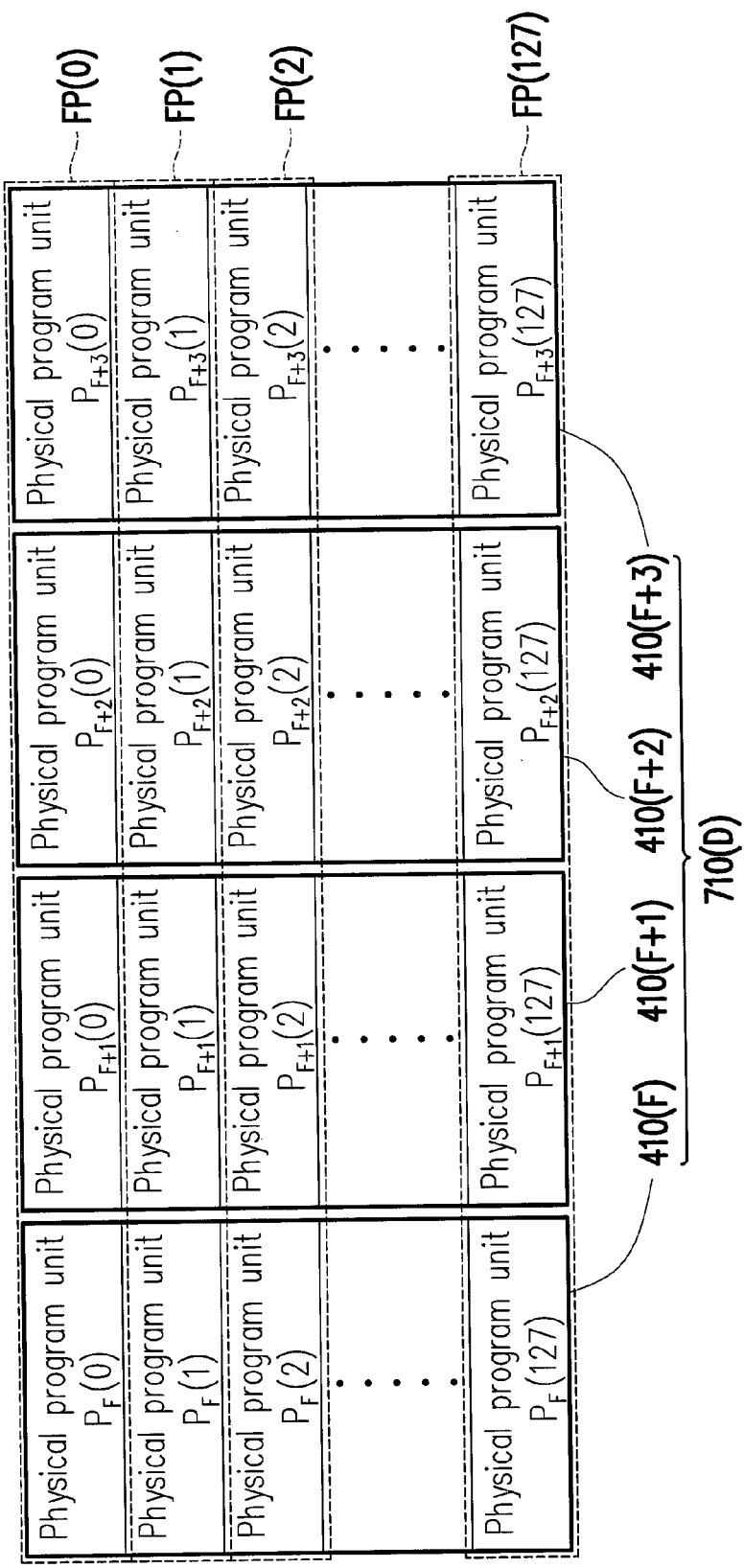
FIG. 6 is a schematic diagram illustrating a physical unit according to an exemplary embodiment of the invention.
Figure 7:
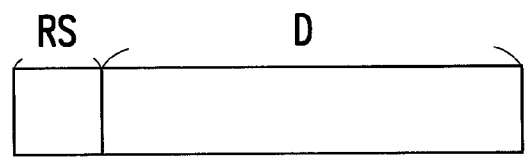
FIG. 7 is a schematic diagram illustrating a physical program unit according to an exemplary embodiment of the invention.

As shown in FIG. 6, according to an exemplary embodiment, the memory management circuit 1043 may retrieve the physical unit 710(D) from the spare area 504, and it is assumed that the physical unit 710(D) includes the physical erase units 410(F), 410(F+1), 410(F+2) and 410(F+3), in which each of said physical erase units includes 128 physical program units (i.e., physical program units $P_F(0)$ to $P_F(127)$, $P_{F+1}(0)$ to $P_{F+1}(127)$, $P_{F+2}(0)$ to $P_{F+2}(127)$ and $P_{F+3}(0)$ to $P_{F+3}(127)$). In the present exemplary embodiment, the memory management circuit 1043 manages the rewritable non-volatile memory module 106 in physical units. Therefore, the physical program units having relative positions in the physical erase units 410(F), 410(F+1), 410(F+2) and 410(F+3) may be paired to compose one physical program unit set. For instance, the physical program units $P_F(0)$, $P_{F+1}(0)$, $P_{F+2}(0)$ and $P_{F+3}(0)$ may be composed into a physical program unit set FP(0), whereas the physical program units $P_F(1)$, $P_{F+1}(1)$, $P_{F+2}(1)$ and $P_{F+3}(1)$ may be composed into a physical program unit set FP(1), the rest may be deduced by analogy. In other words, in the case if the physical unit has n physical erase units, the physical program unit set has n physical program units in said n physical erase units, accordingly. According to present exemplary embodiment as shown in FIG. 7, each physical program unit includes a data record area D and a redundant area RS and uses thereof are described hereinafter. The memory management circuit 1043 may retrieve the physical program unit set form the physical unit 710(D) and write data in all the physical program units that are belonged to the same physical program unit set. However, since the size of each physical program unit set is 4 KB, the data to be written need to be filled until it is a multiple of 4 KB.

Figure 8:
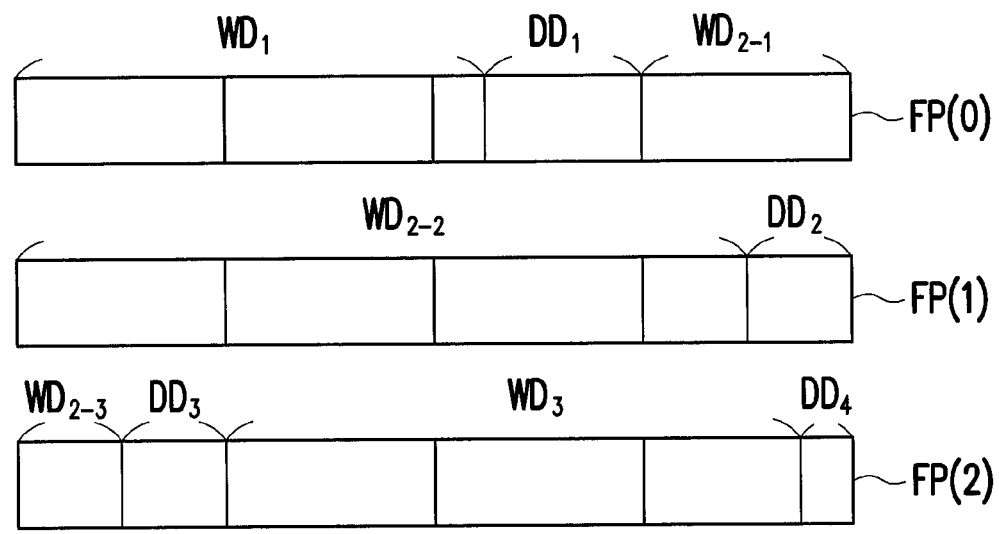
FIG. 8 is a schematic diagram illustrating a process of programming data into physical program unit set according to an exemplary embodiment of the invention.

Further to previous exemplary embodiment, once it is determined that the plurality of data temporarily stored in the buffer memory 1047 is complied with the predetermined condition, the memory management circuit 1043 starts to establish a program command to perform a programming process. As shown in FIG. 8, first, since a size of a entire first data $WD_1$ is only 9 KB, the memory management circuit 1043 additionally fills a fill data $DD_1$ with a size of 3 KB so that all the data to be written may be the multiple of 4 KB, thereby programming the first data $WD_1$, the fill data $DD_1$ being additionally filled and a first part of a second data $WD_{2\_1}$ (with a size of 4 KB) into the physical program unit set FP(0).

Next, the memory management circuit 1043 programs a second part of the second data $WD_{2\_2}$ (with a size of 14 KB) and a fill data $DD_2$ with a size of 2 KB into the physical program unit set FP(1), and programs a third part of the second data $WD_{2\_3}$ (with a size of 2 KB) and a fill data $DD_3$ with a size of 2 KB, and a third data $WD_3$ (with a size of 11 KB) and a fill data $DD_4$ with a size of 1 KB into the physical program unit set FP(2).

After the programming operation to the physical program unit set FP(2) is completed, the memory management circuit 1043 may retrieve three writing statuses indicating that all three data are written into the rewritable non-volatile memory module 106 normally. According to an exemplary embodiment, the memory management circuit 1043 may send three writing-completed messages together to the host system 1000 in respond to the three write commands previously received. According to another exemplary embodiment, if at least one of the three data is not written into the rewritable non-volatile memory module 106 normally, the memory management circuit 1043 may send there writing-error messages together to the host system 1000 so that host system 1000 may re-establish and send the plurality of write commands for writing the three data again. According to yet another exemplary embodiment, since the memory management circuit 1043 may still receives data from the host system 1000 during the programming operation controlled by the rewritable non-volatile memory module 106, in order to avoid data transmission being delayed by the host system 1000 for waiting the respond, the memory management circuit 1043 may send messages indicating that the writing operation is completed in advance. The plurality of writing-error messages are sent together to the host system 1000 only after writing statuses of the plurality of data are obtained and the writing statuses indicates that an error has occurred. In other words, the memory management circuit 1043 may send a plurality of messages indicating the writing statuses corresponding to the plurality of write commands together to the host system 1000. However, timing for responding the messages are not particularly limited in the invention.

In the process of programming the data into the physical program unit set, the memory management circuit 1043 programs the actual data (i.e., the first to the third data as described in above embodiments) and the fill data into the data record area in each of the physical program units forming the physical program unit set, and writes logical access addresses and the numbers of sectors corresponding to the actual data into the redundant area in each of the physical program units forming the physical program unit set. Take the physical program unit set FP(0) for example, in which the data record area in the physical program unit $P_F(0)$ is used to write a 4 KB of the first data, and the logical access address and the number of sectors corresponding to this 4 KB of first data are written into the redundant area in the physical program unit $P_F(0)$. The data record area in the physical program unit $P_{F+1}(0)$ is used to write another 4 KB of the first data, and the logical access address and the number of sectors corresponding to this 4 KB of the first data are written into the redundant area in the physical program unit $P_{F+1}(0)$. The data record area in the physical program unit $P_{F+2}(0)$ is used to write a remaining 1 KB of the first data and a 3 KB of the fill data, and the logical access address and the number of sectors corresponding to said remaining 1 KB of the first data are written into the redundant area in the physical program unit $P_{F+2}(0)$. The data record area in the physical program unit $P_{F+3}(0)$ is used to write a 4 KB of the second data, and the logical access address and the number of sectors corresponding to said 4 KB of the second data are written into the redundant area in the physical program unit) $P_{F+3}(0)$.

Moreover, the memory management circuit 1043 further maintains a comparison table to record a corresponding relation of the physical program unit set with respect to the logical access addresses and the numbers of sectors respectively corresponding to the first-type data and the at least one part of the at least one second-type data programmed into one specific physical program unit set, and the comparison table are written into a specific physical erase unit among the physical erase units 410(0) to 410(N), in which all the physical program units in the specific physical erase unit are not belonged to the physical program unit set. Further to the exemplary embodiment illustrated in FIG. 8, the memory management circuit 1043 may record the logical access address and the number of sectors of the entire first data, and the logical access address and the number of sectors of the first 4 KB (the first part) of the second data are both corresponding to the physical program unit set FP(0) in the comparison table. The logical access address and the number of sectors of another 14 KB (the second part) of the second data are corresponding to the physical program unit set FP(1). The logical access address and the number of sectors of the last 2 KB (the third part) of the second data and the logical access address and the number of sectors of the entire third data are both corresponding to the physical program unit set FP(2). Once the physical unit 710(D) is fully written with data, or the memory storage device 100 is complied with a specific condition, the memory management circuit 1043 may perform a data merging process according to said comparison table.

It should be noted that, in the case if the memory management circuit 1043 fails to record said corresponding relation into the comparison table due to power failure of the memory storage device 100, the memory management circuit 1043 may read the redundant area in each of the physical program units in the physical program unit set in the physical unit 710(D) after the power is backed on, so as to retrieve and write the corresponding relation into the comparison table.

According to above exemplary embodiments, regardless of the amount of the write command received, in the case if at least one data belonging to the first-type data (i.e., its size being smaller than the data size threshold) is received and the size of the plurality of data temporarily stored in the buffer memory 1047 is yet reaching the size of the one physical program unit set (i.e, the size of n physical program unit), the memory management circuit 1043 may continued to temporarily store the data from the host system 1000 into the buffer memory 1047. The first-type and at least a part of other data temporarily stored are practically programmed into the physical program unit set only until the size of the plurality of data temporarily stored reaches the size of one physical program unit set. In comparing to the method of programming data corresponding to each write command received into the rewritable non-volatile memory module 106, the method of the present exemplary embodiment may increase overall efficiency of the system program process, thereby increasing overall data-writing speed of the system so that the rewritable non-volatile memory module 106 may be utilized more efficiently. Furthermore, the memory management circuit 1043 may obtain writing statuses of the first-type data and at least the part of other data temporarily stored, and replying the plurality of writing-completed messages to the host system 1000 in respond to the plurality of write commands previously received, so as to achieve the purpose of ensuring the data is securely written into the memory storage device 100.

According to another exemplary embodiment, in the case if one first-type and one or more of the second-type data are received by the memory management circuit 1043, the memory management circuit 1043 may determine whether the plurality of data temporarily stored in the buffer memory 1047 are complied with a predetermined condition if a period of time that no other data is received by the memory memory management circuit 1043 exceeds a time threshold. In this case, regardless of whether the size of the plurality of data temporarily stored in the buffer memory 1047 reaches the size of one physical program unit set, the memory management circuit 1043 may establish a program command to program the first-type data and the at least one part of the at least one second-type data into the physical program unit set. Accordingly, the memory management circuit 1043 may obtain the writing statuses of the first-type data and the at least one part of the at least one second-type data and reply a plurality of messages related to the writing statuses of said data together to the host system 1000.

In above exemplary embodiments, the memory management circuit 1043 retrieves one dedicated physical unit from the spare area 504 and a physical program unit set has using a plurality of physical program units therein. By using the management architecture as described above, in the case if data from the host system 1000 is intended to modify certain data which is already present, above-said mechanism may not be sued by the memory management circuit 1043 to program the data into the physical program unit set.

According to another exemplary embodiment, the physical erase units 410(0) to 410(N) in the rewritable non-volatile memory module 106 are not logically grouped by the memory management circuit 1043 as shown in FIG. 4. Based on above, the memory management circuit 1043 may retrieve arbitrary n physical erase units from the rewritable non-volatile memory module 106 and one physical program unit set has using the n physical program units within the retrieved n physical erase units. However, the detailed description related to the method of temporarily storing a plurality of data including a first-type data and at least one second-type data received into the buffer memory 1047, the method of programming the first-type data and at least a part of the second-type data into the physical program unit set at the same time if the plurality of data are determined to be complied with a predetermined condition and method of obtaining writing statuses of the data actually being programmed, are identical or similar to those in the previous exemplary embodiments, so they are omitted hereinafter.

Figure 9:
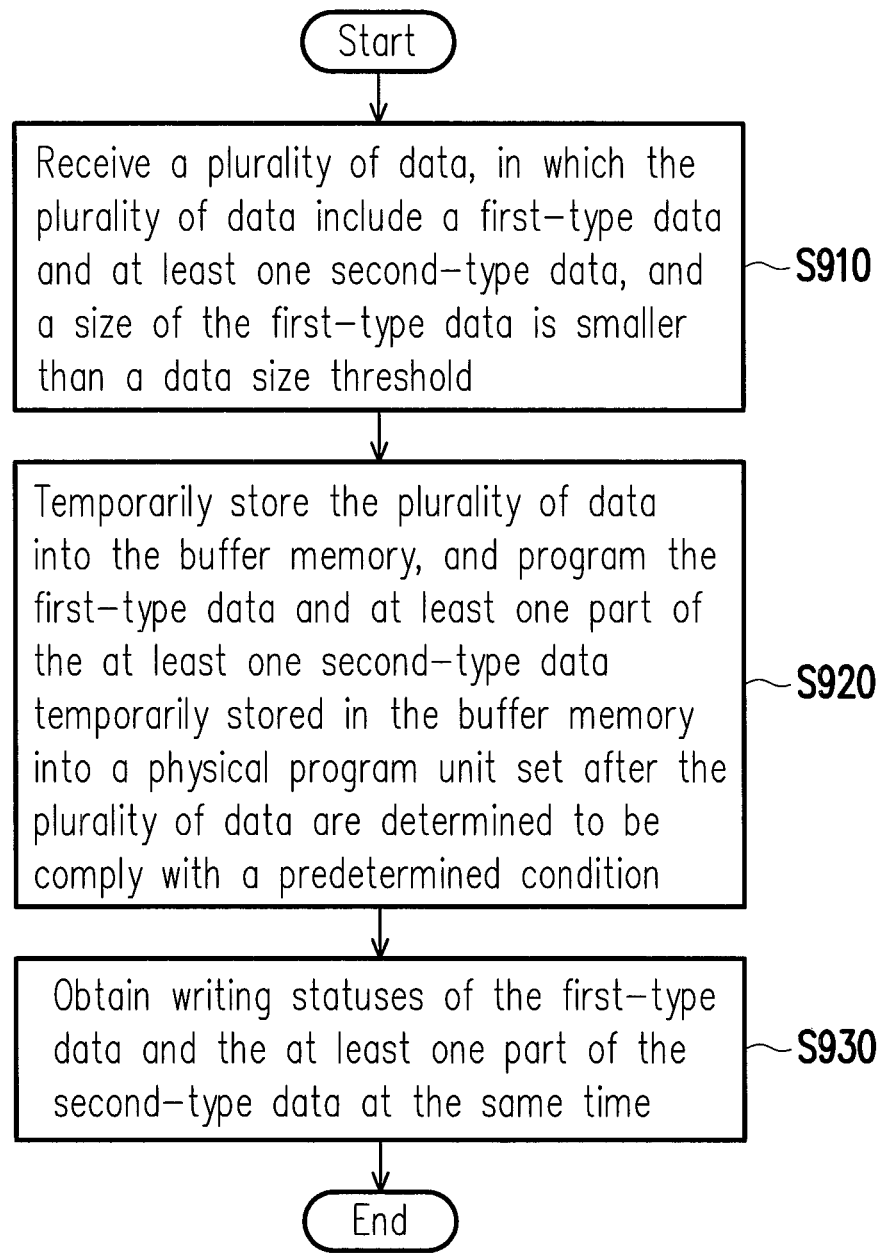
FIG. 9 is a flowchart illustrating a method for programming data according to an embodiment of the invention.

FIG. 9 is a flowchart illustrating a method for programming data according to an embodiment of the invention.

Referring to FIG. 9, first, as shown in step S910, the memory management circuit 1043 receives a plurality of data from the host system 1000. The plurality of data include a first-type data and at least one second-type data, in which a size of the first-type data is smaller than a data size threshold, whereas a size of the second-type data is not particularly limited.

Next in step S920, the memory management circuit 1043 temporarily stores the plurality of data into the buffer memory 1047 and programs the first-type data and at least one part of the at least one second-type data temporarily stored in the buffer memory 1047 into a physical program unit set if it is determined that the plurality of data are complied with a predetermined condition, and the physical program unit set has n physical program units. In which, the predetermined condition may be, for example, if a size of the plurality of data reaches a size of the physical program unit set and/or if a period of time that no other data is received by the memory management circuit 1043 exceeds a time threshold.

Lastly, as shown in step S930, the memory management circuit 1043 obtains writing statuses of the first-type data programmed and the at least one part of the at least one second-type data programmed at the same time.

In view of above, if the host system intends to write one first-type data and at least one second-type data, the method for programming data, the memory storage device and the memory controller of the invention are capable of temporarily storing said data into buffer memory until it is determined that the data temporarily stored are complied with a predetermined condition, so that the first-type data and at least one part of the second-type data may be programmed together into the rewritable non-volatile memory module, thereby increasing overall data-writing efficiency. Moreover, the method for programming data, the memory storage device and the memory controller of the invention are also capable of obtaining writing statuses of the data being programmed, and sending a plurality of corresponding messages to the host system in respond to a plurality of write commands previously received. As a result, a secure data-writing may be ensured for the memory storage device while effects of both performance and data reliability may also be achieved.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A method for programming data, adapted for a memory storage device, the memory storage device comprises a buffer memory and a rewritable non-volatile memory module, the rewritable non-volatile memory module has a plurality of physical erase units, and each of the physical erase units has a plurality of physical program units, the method comprises:
   receiving a plurality of data, wherein the plurality of data comprise a first-type data and at least one second-type data, wherein a size of the first-type data is smaller than a data size threshold;
   temporarily storing the plurality of data into the buffer memory, and programming the first-type data and at least one part of the at least one second-type data temporarily stored in the buffer memory into a physical program unit set after the plurality of data are determined to be complied with a predetermined condition, wherein the physical program unit set has n physical program units and n is a positive integer; and
   obtaining writing statuses of the first-type data and the at least one part of the at least one second-type data at the same time.

2. The method for programming data of claim 1, wherein the plurality of data are determined to be complied with the predetermined condition if a size of the plurality of data temporarily stored in the buffer memory reaches a size of the physical program unit set.

3. The method for programming data of claim 1, wherein the plurality of data are determined to be complied with the predetermined condition if a period of time that no other data is received by the memory storage device exceeds a time threshold.

4. The method for programming data of claim 1, wherein each of the physical program units comprises a data record area and an redundant area, and the step of programming the first-type data and the at least one part of the at least one second-type data temporarily stored in the buffer memory into the physical program unit set comprises:
   writing the first-type data and the at least one part of the at least one second-type data into the data record areas of the n physical program units forming the physical program unit set; and
   writing a logical access address and a number of sectors respectively corresponding to the first-type data and the at least one part of the at least one second-type data into the redundant areas of the n physical program units forming the physical program unit set.

5. The method for programming data of claim 1, further comprising:
   maintaining a comparison table to record a corresponding relation of the physical program unit set with respect to the logical access address and the number of sectors respectively corresponding to the first-type data and the at least one part of the at least one second-type data programmed into the physical program unit set; and
   writing the comparison table into a specific physical erase unit among the physical erase units, wherein all the physical program units in the specific physical erase unit are not belonged to the physical program unit set.

6. The method for programming data of claim 1, wherein the writing statuses of the first-type data and the at least one part of the at least one second-type data are replied together to a host system that sent the plurality of data.

7. A memory controller, configured to manage a rewritable non-volatile memory module, the memory controller comprises:
   a host system interface configured to electrically connect a host system;
   a memory interface configured to electrically connect the rewritable non-volatile memory module, wherein the rewritable non-volatile memory module has a plurality of physical erase units, and each of the physical erase units has a plurality of physical program units;
   a buffer memory; and
   a memory management circuit electrically connected to the host system interface, the memory interface and the buffer memory,
   wherein the memory management circuit receives a plurality of data, wherein the plurality of data comprise a first-type data and at least one second-type data, wherein a size of the first-type data is smaller than a data size threshold, the memory management circuit temporarily stores the plurality of data into the buffer memory, and programs the first-type data and at least one part of the at least one second-type data temporarily stored in the buffer memory into a physical program unit set after the plurality of data are determined to be complied with a predetermined condition, wherein the physical program unit set has n physical program units and n is a positive integer, the memory management circuit obtains writing statuses of the first-type data and the at least one part of the at least one second-type data at the same time.

8. The memory controller of claim 7, wherein the plurality of data are determined to be complied with the predetermined condition by the memory management circuit if a size of the plurality of data temporarily stored in the buffer memory reaches a size of the physical program unit set.

9. The memory controller of claim 7, wherein the plurality of data are determined to be complied with the predetermined condition by the memory management circuit if a period of time that no other data is received by the memory management circuit exceeds a time threshold.

10. The memory controller of claim 7, wherein each of the physical program units comprises a data record area and an redundant area, and the memory management circuit programs the first-type data and the at least one part of the at least one second-type data temporarily stored in the buffer memory into a physical program unit set by writing the first-type data and the at least one part of the at least one second-type data into the data record areas of the n physical program units forming the physical program unit set, and writing a logical access address and a number of sectors respectively corresponding to the first-type data and the at least one part of the at least one second-type data into the redundant areas of the n physical program units forming the physical program unit set.

11. The memory controller of claim 10, wherein the memory management circuit is further configured to maintain a comparison table to record a corresponding relation of the physical program unit set with respect to the logical access address and the number of sectors respectively corresponding to the first-type data and the at least one part of the at least one second-type data programmed into the physical program unit set, and write the comparison table into a specific physical erase unit among the physical erase units, wherein all the physical program units in the specific physical erase unit are not belonged to the physical program unit set.

12. The memory controller of claim 7, wherein the writing statuses of the first-type data and the at least one part of the at least one second-type data are replied together to the host system that sent the plurality of data.

13. A memory storage device, comprising:
a rewritable non-volatile memory module having a plurality of physical erase units, and each of the plurality of the physical erase units has a plurality of physical program units;
a connector configured to electrically connect a host system;
a memory controller electrically connected to the rewritable non-volatile memory and the connector, the memory controller comprises a buffer memory,
the memory controller receives a plurality of data, the plurality of data comprise a first-type data and at least one second-type data, wherein a size of the first-type data is smaller than a data size threshold,
the memory controller temporarily stores the plurality of data into the buffer memory, and programs the first-type data and at least one part of the at least one second-type data temporarily stored in the buffer memory into a physical program unit set after the plurality of data are determined to be complied with a predetermined condition, wherein the physical program unit set has n physical program units and n is a positive integer,
the memory controller obtains writing statuses of the first-type data and the at least one part of the at least one second-type data at the same time.

14. The memory storage device of claim 13, wherein the plurality of data are determined by the memory controller to be complied with the predetermined condition if a size of the plurality of data temporarily stored in the buffer memory reaches a size of the physical program unit set.

15. The memory storage device of claim 13, wherein the plurality of data are determined by the memory controller to be complied with the predetermined condition if a period of time that no other data is received by the memory controller exceeds a time threshold.

16. The memory storage device of claim 13, wherein each of the physical program units comprises a data record area and an redundant area, and the memory controller programs the first-type data and the at least one part of the at least one second-type data temporarily stored in the buffer memory into a physical program unit set by writing the first-type data and the at least one part of the at least one second-type data into the data record areas of the n physical program units forming the physical program unit set, and writing a logical access address and a number of sectors respectively corresponding to the first-type data and the at least one part of the at least one second-type data into the redundant areas of the n physical program units forming the physical program unit set.

17. The memory storage device of claim 16, wherein the memory controller is further configured to maintain a comparison table to record a corresponding relation of the physical program unit set with respect to the logical access address and the number of sectors respectively corresponding to the first-type data and the at least one part of the at least one second-type data programmed into the physical program unit set, and write the comparison table into a specific physical erase unit among the physical erase units, wherein all the physical program units in the specific physical erase unit are not belonged to the physical program unit set.

18. The memory storage device of claim 13, wherein the writing statuses of the first-type data and the at least one part of the at least one second-type data are replied together to the host system that sent the plurality of data.

* * * * *